(12) United States Patent
Hamada

(10) Patent No.: US 6,788,564 B2
(45) Date of Patent: Sep. 7, 2004

(54) FERROELECTRIC STORAGE APPARATUS, DRIVING METHOD THEREFOR, AND DRIVING CIRCUIT THEREFOR

(75) Inventor: Yasuaki Hamada, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/396,372

(22) Filed: Mar. 26, 2003

(65) Prior Publication Data
US 2004/0109363 A1 Jun. 10, 2004

(30) Foreign Application Priority Data

Mar. 27, 2002 (JP) .................................... 2002-089173

(51) Int. Cl.[7] .......................... G11C 11/22; G11C 11/24
(52) U.S. Cl. ...................................... 365/145; 365/149
(58) Field of Search .............................. 365/145, 149

(56) References Cited

U.S. PATENT DOCUMENTS

| 5,640,030 | A | * | 6/1997 | Kenney | 365/145 |
| 6,038,161 | A | * | 3/2000 | Fuchikami | 365/145 |
| 6,356,475 | B1 | * | 3/2002 | Tamura et al. | 365/145 |
| 6,411,541 | B2 | * | 6/2002 | Maruyama | 365/145 |

FOREIGN PATENT DOCUMENTS

| JP | A-6-77434 | 3/1994 |
| JP | A-9-82083 | 3/1997 |
| JP | A-9-91970 | 4/1997 |
| JP | A-9-116107 | 5/1997 |
| JP | A-2001-515256 | 9/2001 |
| JP | A-2002-157875 | 5/2002 |

* cited by examiner

Primary Examiner—Trong Phan
(74) Attorney, Agent, or Firm—Oliff & Berridge, PLC

(57) ABSTRACT

The invention provides a ferroelectric storage apparatus which can reduce or prevent disturbance, a driving method therefor, and a driving circuit therefor. In the ferroelectric storage apparatus, an operation step of applying one of data reading, data re-writing, and data writing to at least one selected cell among a plurality of ferroelectric memory cells formed at the intersections of a plurality of word lines and a plurality of bit lines is repeatedly performed. A disturbance prevention step of applying a voltage to each of the plurality of ferroelectric memory cells in an electric-field direction in which the stored data of each ferroelectric memory cell is not inverted is performed after the operation step is executed at least once. With this, a voltage is applied to not-selected cells at a certain frequency in an electric-field direction in which the stored data of the not-selected cells is not inverted, and data deterioration is reduced or suppressed.

11 Claims, 14 Drawing Sheets

FERROELECTRIC STORAGE APPARATUS, DRIVING METHOD THEREFOR, AND DRIVING CIRCUIT THEREFOR

BACKGROUND OF THE INVENTION

1. Field of Invention

The present invention relates to ferroelectric storage apparatuses, driving methods therefor, and driving circuits therefor.

2. Description of Related Art

Ferroelectric storage apparatuses having ferroelectric capacitors as storage elements may serve as memory devices to possibly substitute for related art memories. This may be possible because the ferroelectric storage apparatuses have an operation speed that is as fast as DRAMs and are non-volatile as flash memories.

The related art ferroelectric storage apparatuses include active ferroelectric memories which have 1T/1C cells, each of which has one transistor and one capacitor (ferroelectric) or 2T/2C cells, each of which has a 1T/1C cell and a reference cell. Since there is a limit on the level of integration of 1T/1C cells and 2T/2C cells, a smaller memory-element structure is advantageous in terms of future high integration.

Since ferroelectric materials themselves have a storage holding function, and a memory operation is possible only with ferroelectric capacitors, a structure (1C cell) in which a memory cell is formed of one ferroelectric capacitor only is disclosed in Japanese Unexamined Patent Application Publication No. Hei-9-116107 and PCT Japanese Translation Patent Publication No. 2001-515256.

Since an unnecessary voltage is applied during a non-selection period in the 1C-cell structure, however, the data may deteriorate to cause disturbance finally in which the storage state cannot be determined. Therefore, the related art 1C-cell structure is not practical.

SUMMARY OF THE INVENTION

The present invention provides ferroelectric storage apparatuses which can reduce or prevent the disturbance, driving methods therefor, and driving circuits therefor.

In a ferroelectric storage apparatus, a driving method therefor, and a driving circuit therefor according to each aspect of the present invention, an operation step (operation mode) of applying one of data reading, data re-writing, and data writing to at least one selected cell among a plurality of ferroelectric memory cells formed at the intersections of a plurality of word lines and a plurality of bit lines is performed. A disturbance prevention step (disturbance prevention mode) of applying a voltage to each of the plurality of ferroelectric memory cells in an electric-field direction in which the stored data of each ferroelectric memory cell is not inverted is performed after the operation step is executed at least once.

Therefore, a voltage is always applied to not-selected cells at a certain frequency in an electric-field direction in which the stored data of the not-selected cells is not inverted, and data deterioration is reduced or suppressed.

The present invention is especially suited to so-called crossing-point or passive ferroelectric storage apparatuses in which each of the plurality of ferroelectric memory cells is formed of a ferroelectric capacitor only. This is because, in this case, although a voltage may be applied to the not-selected cell in an electric-field direction in which the stored data of the not-selected cells is inverted, when the operation step is applied to the selected cell, the disturbance prevention step reduces or prevents a voltage from being continuously applied to the not-selected cells in the electric-field direction in which the stored data of the non-selected cells is inverted.

In the operation step, one of a first-polarity selection voltage or a second-polarity selection voltage is applied to the at least one selected cell, and one or both of a first-polarity non-selection voltage and a second-polarity non-selection voltage is applied to not-selected cells. In the disturbance prevention step performed thereafter, the first-polarity non-selection voltage and the second-polarity non-selection voltage may be alternately applied to each of the plurality of ferroelectric memory cells.

With this, irrespective of whether the stored data of each memory cell is "0" or "1", a voltage is always applied to all memory cells periodically in an electric-field direction in which the stored data of all the memory cells is not inverted, and data deterioration is reduced or suppressed.

A ferroelectric storage apparatus according to one aspect of the present invention has a structure which includes a plurality of word lines disposed in parallel to each other; a plurality of bit lines disposed in parallel to each other and intersecting with the plurality of word lines; a plurality of ferroelectric memory cells formed at the intersections of the plurality of word lines and the plurality of bit lines; a word-line driver to drive the plurality of word lines; and a bit-line driver to drive the plurality of bit lines. In a driving circuit for a ferroelectric storage apparatus, according to another aspect of the present invention, the word-line driver and the bit-line driver of the above-described ferroelectric storage apparatus are disposed. The method described above according to the present invention is performed also in the ferroelectric storage apparatuses and the driving circuit.

BRIEF DESCRIPTION OF THE DRAWINGS

FIG. 6(A) is a waveform showing a driving method in a comparison example, and FIG. 6(B) is a waveform showing a driving method in an exemplary embodiment of the present invention;

DETAILED DESCRIPTION OF PREFERRED EMBODIMENTS

Figure 1:
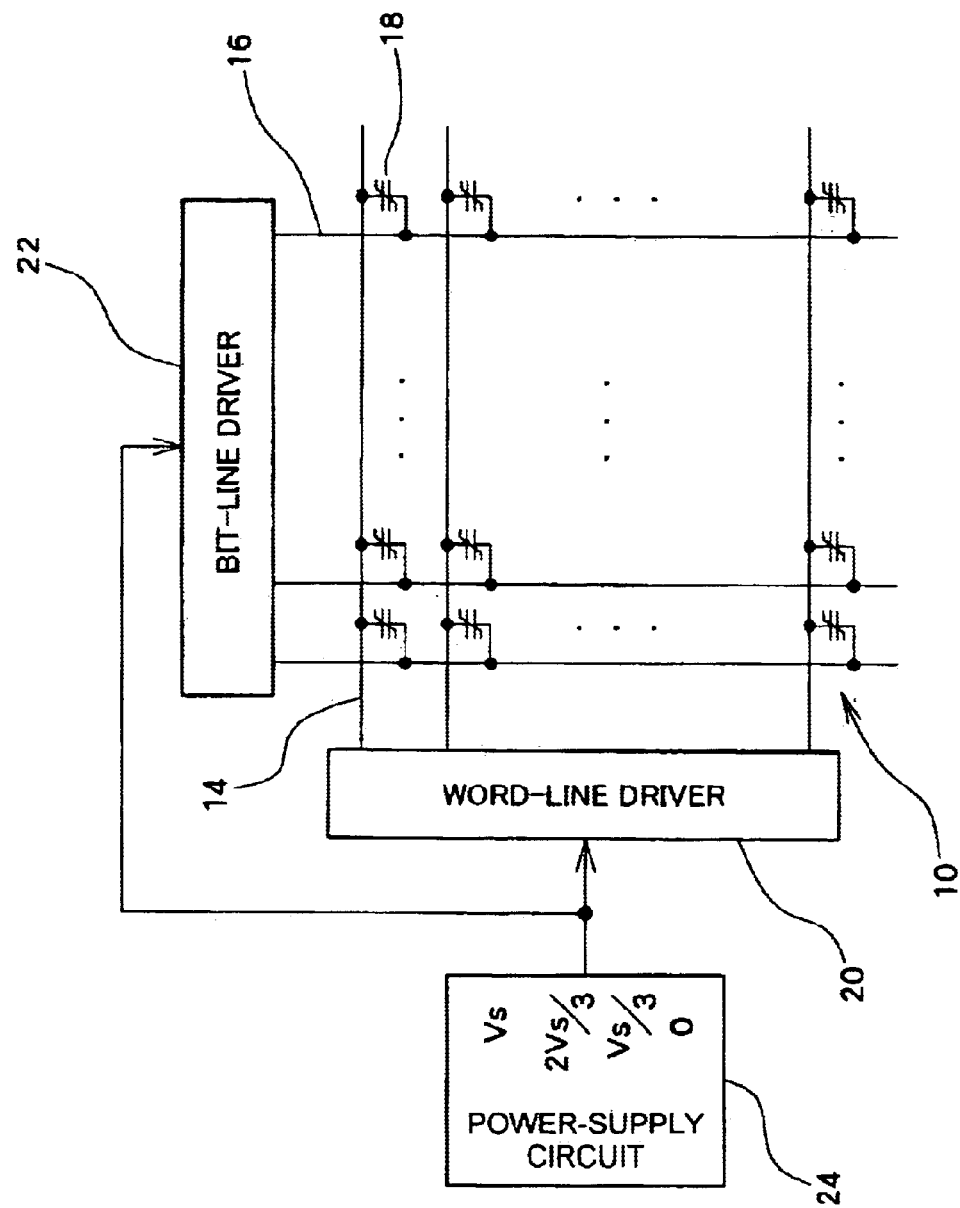
FIG. 1 is a schematic of a ferroelectric storage apparatus according to an exemplary embodiment of the present invention.

Exemplary embodiments of the present invention are described below specifically by referring to the drawings.

First Exemplary Embodiment
(Description of ferroelectric storage apparatus)

Figure 2:
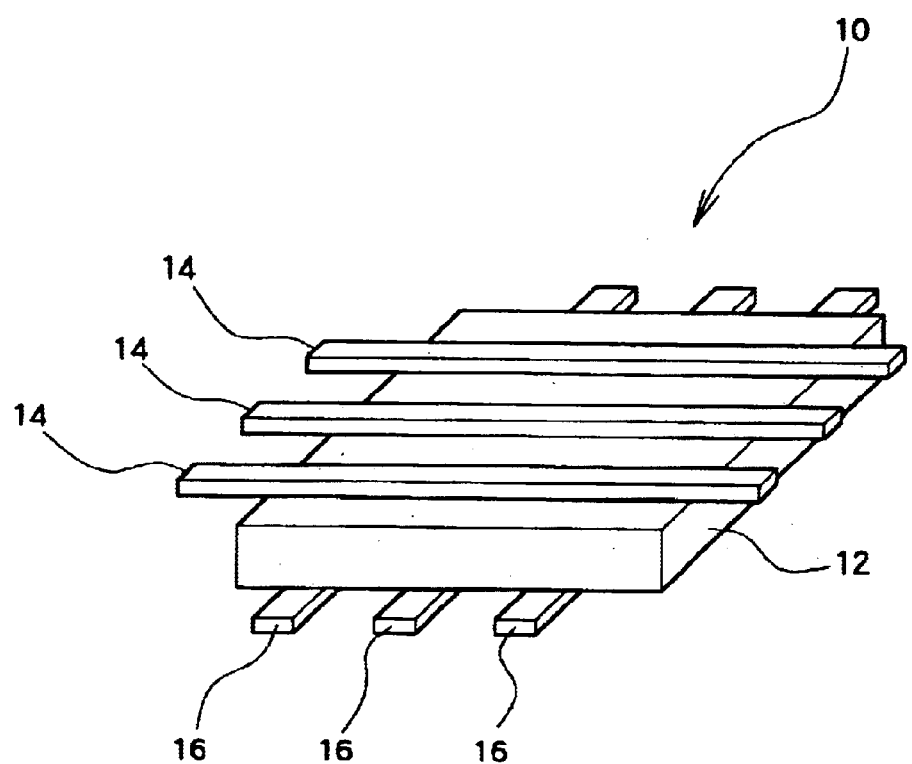
FIG. 2 is a schematic perspective view of a memory cell array shown in FIG. 1.

FIG. 1 is a schematic of an FeRAM serving as a ferroelectric storage apparatus according to a first exemplary embodiment of the present invention, and FIG. 2 is a schematic perspective view showing a memory array thereof. As shown in FIG. 2, a memory cell array 10 includes a ferroelectric thin film 12, a plurality of word lines 14 arranged on one surface of the ferroelectric thin film 12, and a plurality of bit lines 16 arranged on the other surface of the ferroelectric thin film 12.

With the above-described structure, at each of the intersections (crossing points) of the plurality of word lines 14 and the plurality of bit lines 16, a ferroelectric memory cell 18 is formed as shown in FIG. 1. From such a structure, the memory shown in FIG. 2 is called a crossing-point FeRAM or a passive FeRAM. Therefore, the memory shown in FIG. 2 is different from an active memory, which has 1T/1C cells, each of which has one transistor and one capacitor (ferroelectric) or 2T/2C cells each of which has a 1T/1C cell and a reference cell.

Since the FeRAM according to the present invention does not need to have transistors in the memory cell array 10, it can be highly integrated, and in addition, the structure shown in FIG. 2 can be laminated in multiple stages. A driving circuit substrate on which a CMOS logic is mounted can be disposed, for example, below the structure shown in FIG. 2.

As a ferroelectric used in the present embodiment, an inorganic material, such as SBT (strontium-bismuth-tantalum), PZT (lead-zirconium-titanium), BLT (bismuth-lanthanum-titanium) or an oxide of one of these, can be suitably used. Other inorganic materials, or organic materials may be used.

As an electrode material constituting the word lines 14 and the bit lines 16, used in the present exemplary embodiment, platinum (Pt), iridium (Ir), iridium oxide ($IrO_2$), strontium-ruthenium, or an oxide of one of these can be suitably used in view of their high oxidation resistance and heat resistance. Other electrically conductive material may be used.

As a driving circuit system for the memory cell array 10, a word-line driver 20 to drive the plurality of word lines 14, a bit-line driver 22 to drive the plurality of bit lines 16, and a power-supply circuit 24 to supply plurality of types of driving voltages (Vs, 2Vs/3, Vs/3, and 0) to the word-line driver 10 and the bit-line driver 22 are provided. The word-line driver 20 is connected to an end (left-hand end in FIG. 1) of each of the plurality of word lines 14, and the bit-line driver 22 is-connected to one end (upper-end in FIG. 1) of each of the plurality of bit lines 16.

The word-line driver 20 includes a row-direction address decoder, and supplies the potential corresponding to a read mode, a write mode, or a rewrite mode (and data to be written in the write mode or the rewrite mode) to one word line 14 address selected, and to the other non-selected word lines 14. In the same way, the bit-line driver 22 includes a column-direction address decoder, and supplies the potential corresponding to the read mode, the write mode, or the rewrite mode (and data to be written in the write mode or the rewrite mode) to at least one bit line 16 address selected, and to the other not-selected bit lines 14.

The word-line driver 20 and the bit-line driver 22 supply the potential to the word lines 14 and the bit lines 16 in the above-described operation modes, and in addition, have a function to supply a potential to the word lines 14 and the bit lines 16 in order to perform a disturbance prevention step thereafter.

(Description of general operation)

Figure 3:
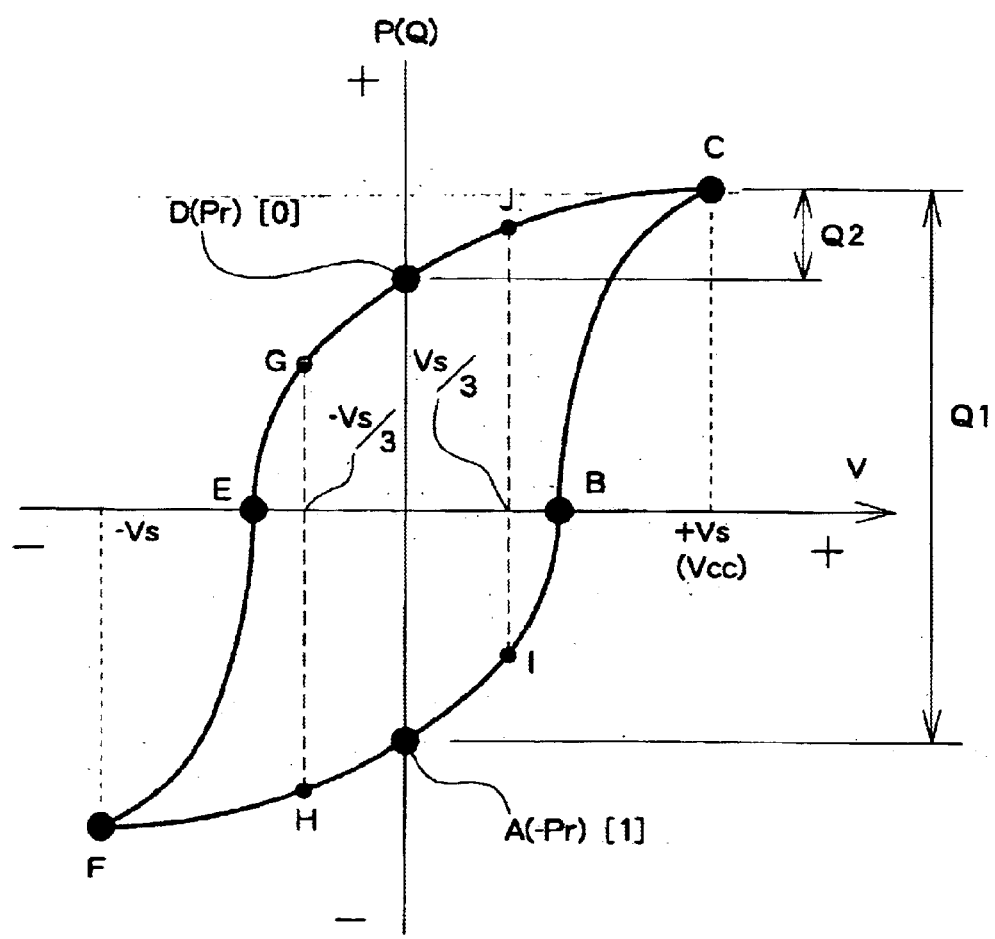
FIG. 3 is a hysteresis characteristic graph of a ferroelectric memory cell shown in FIG. 1.

The operation of FeRAM shown in FIG. 1 is described below. FIG. 3 shows the hysteresis characteristic of the voltage dependency of spontaneous polarization P or a polarization charge Q (a change in polarization multiplied by the area of the capacitor) in the memory cell 18 shown in FIG. 1.

In FIG. 3, a direction in which the potential of the word lines 14 becomes higher than that of the bit lines 16 is set to a plus direction as an example. When the word lines 14 and the bit lines have the same potential (including a case when both lines have 0 V at power off) the voltage applied to the memory cell 18 is 0 V. In this case, the ferroelectric capacitor has two types of residual dielectric polarization ±Pr (points A and D in FIG. 3). When a definition is made such that the residual dielectric polarization +Pr at point D in FIG. 3 corresponds to a memory state of "0" and the residual dielectric polarization −Pr at point A in FIG. 3 corresponds to a memory state of "1", for example, binary storage states are obtained.

Points C and F in FIG. 3 indicate the saturated polarization points of the ferroelectric memory cell 18. The polarization direction reverses at points B and E in FIG. 3. Like points B and E, voltages which make the polarization value zero are called coercive voltages.

According to the hysteresis characteristic shown in FIG. 3, it is necessary that a voltage Vs is applied to the ferroelectric memory cell 18 to change the state to point C in FIG. 3, and then, 0 V is applied to the ferroelectric memory cell 18 to change to point D, in order to write data of "0". Conversely, to write data of "1", it is necessary that a voltage −Vs is applied to the ferroelectric memory cell 18 to change the state to point F in FIG. 3, and then, 0 V is applied to the ferroelectric memory cell 18 to change to point A.

Data is read by applying a voltage +Vs to the ferroelectric memory cell 18 which is in the polarization state at point A or at point D.

Even when the residual dielectric polarization of a selected cell 18a is at either point A or point D, the polarization state at point C in FIG. 3 is obtained by the read operation described above. In this case, when a transition is made from point A to point C (a memory state of "1" is read), the polarization direction reverses from the negative direction to the positive direction across point B where the polarization value is 0. Therefore, the current corresponding to a relatively large amount Q1 of charge shown in FIG. 3 flows into the bit lines 16. On the other hand, when a transition is made from point D to point C (a memory state of "0" is read), the polarization direction does not reverse. Therefore, the current corresponding to a relatively small amount Q2 of charge shown in FIG. 3 flows into the bit lines 16. Consequently, the current flowing into the bit lines 16 is compared with a reference current not shown to determine whether the memory state is "1" or "0".

Potential settings for the word lines 14 and the bit lines 16 are described below by taking reading of data as an example. These potential settings are performed by the word-line driver 20 and the bit-line driver 22, which receive the four types of potentials (Vs, 2Vs/3, Vs/3, and 0) from the power-supply circuit 24. Potentials of Vs and 0 serve as two types of selection potentials, and potentials of 2Vs/3 and Vs/3 serve as two types of non-selection potentials.

Figure 4:
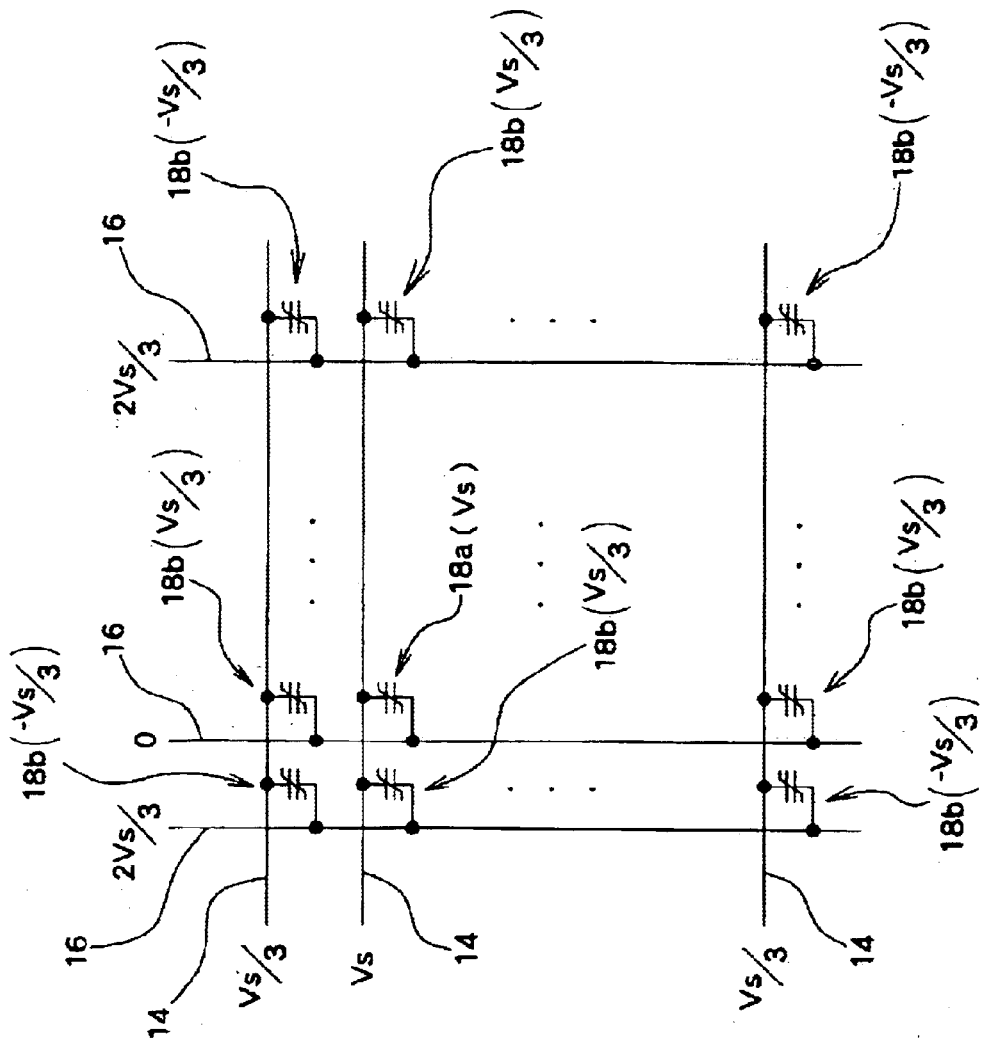
FIG. 4 is a schematic showing the set potentials of word lines and bit lines used when a ferroelectric memory cell array is read (data "0" is written)

FIG. 4 shows one selected cell 18a and other not-selected cells 18b. The word line 14 connected to the selected cell 18a, located at an address (2, 2) is set to have a potential of Vs (word selection potential), and the bit line 16 connected thereto is set to have a potential of 0 (bit selection potential). Therefore, a positive voltage of Vs=Vs−0 is applied to the selected cell 18a. Consequently, residual dielectric polarization in the selected cell 18a, which is at either point A or point D in FIG. 3, is changed to the polarization state of point C in FIG. 3 by the above-described read operation. By detecting the current of the bit line 16 connected to the selected cell 18a, it can be determined whether the memory state is "1" or "0" as described above.

Setting to the polarization state of point C in FIG. 3 is also obtained by the operation of writing data "0". Therefore, to write data "0", it is necessary to set the potentials as shown in FIG. 4.

An actual data read operation is applied to a plurality of memory cells 18 connected to one word line 14 at the same time, and a group of data, such as eight-bit data or 16-bit data, is read at a time.

(Description of disturbance phenomenon)

In this data reading, all the word lines 14 connected to the not-selected cells 18b shown in FIG. 4 are set to have a potential of Vs/3 (word non-selection potential), and all the bit lines 16 connected to the not-selected cells 18b are set to have a potential of 2Vs/3 (bit non-selection potential).

In this case, a potential of ±Vs/3 is applied to the not-selected cells 18b. As a result, not-selected cells 18b which are in the polarization state of point A is changed to have that of point H or point I in FIG. 3. When a transition is made from point A to point I, since the transition does not pass through the inversion point B, the stored data is not inverted. Not-selected cells 18b which are in the polarization state of point D is changed to have that of point G or point J in FIG. 3. Also in this case, when a transition is made from point D to point G, since the transition does not pass through the inversion point E, the stored data is not inverted.

When the non-selection voltage is repeatedly applied to not-selected cells every time the reading operation mode is used, for example, data may deteriorate depending on the electric-field direction. This phenomenon is described below by referring to FIG. 5.

Figure 5:
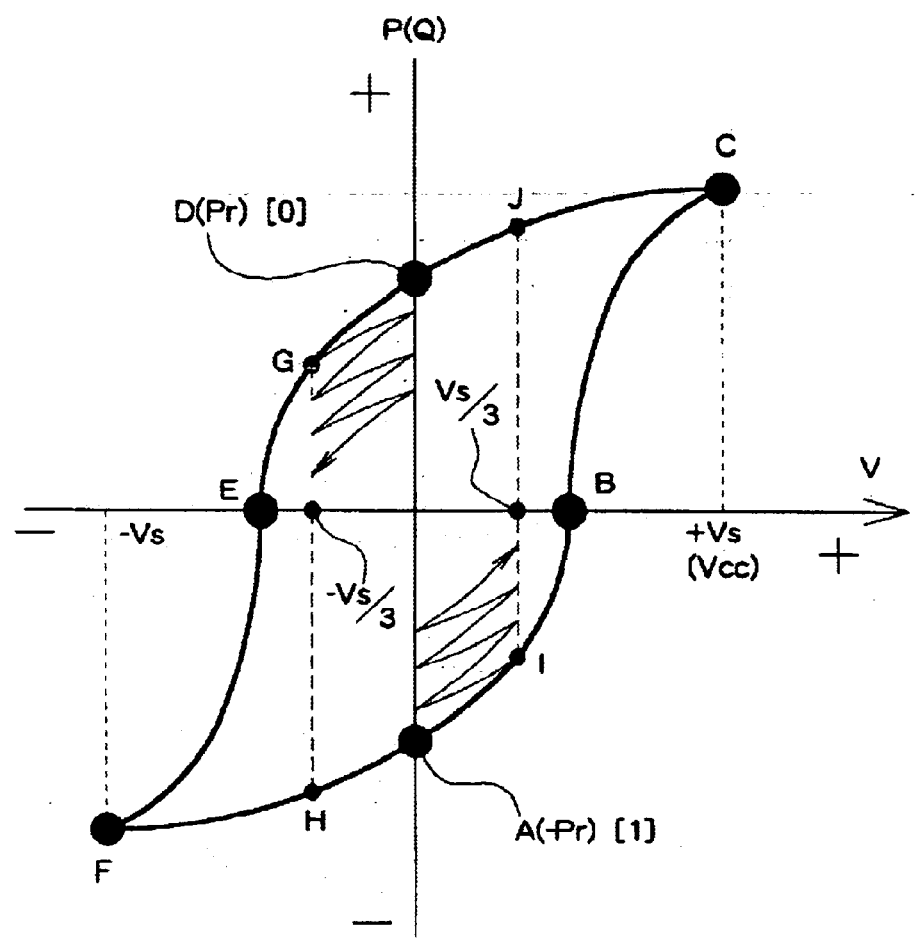
FIG. 5 is a graph describing a disturbance phenomenon of a ferroelectric capacitor.

FIG. 5 shows a case in which a non-selection voltage of −Vs/3 is applied $10^n$-order times repeatedly at every operation mode of a selected cell, in the electric-field direction in which the polarization state is inverted (the electric-field direction used in transition toward point E, which is the negative electric-field direction) to not-selected memory cells which are at the polarization state of point D. In the same way, FIG. 5 shows a case in which a non-selection voltage of Vs/3 is applied $10^n$-order times repeatedly at every operation mode of a selected cell, in electric-field directions in which the polarization state is inverted (the electric-field direction used in transition toward point B, which is the positive electric-field direction) to not-selected memory cells which are at the polarization state of point A.

In both cases, as the number "n" of the power of the repetition number $10^n$ increases, the absolute value of the residual dielectric polarization Pr or −Pr is reduced. Then, polarization charges do not have a sufficient margin at data reading, and data cannot be read.

(Driving method in the present exemplary embodiment)

Figure 6:
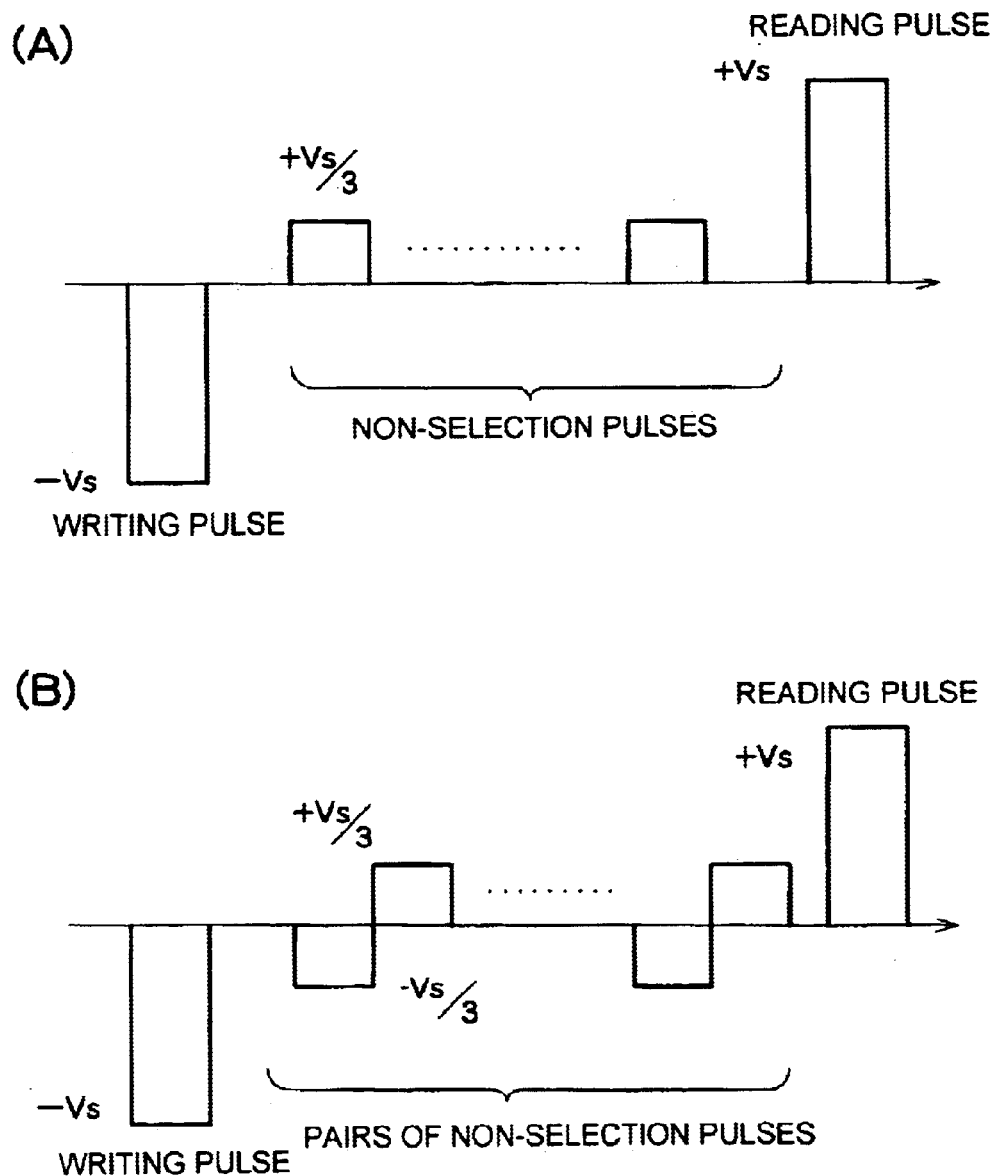
FIGS. 6(A) and 6(B) are waveforms, where

In the present exemplary embodiment, the above-described disturbance phenomenon is reduced. A simplified solving principle is illustrated in FIG. 6(A) and FIG. 6(B). FIG. 6(A) shows a driving method in comparison example, and FIG. 6(B) shows a driving method in the present exemplary embodiment.

Both FIG. 6(A) and FIG. 6(B) show a case in which a writing pulse (−Vs) in the negative electric-field direction is applied to a ferroelectric capacitor to make a transition of the polarization state to point F in FIG. 3, and data "1" is written. This writing operation is the same as a re-writing operation used for making a transition to point F through point D in FIG. 3 after a transition is made from point A (a state where data "1" is stored) in FIG. 3 to point C to read data "1".

In FIG. 6(A), during non-selection periods thereafter, a non-selection voltage (Vs/3) in the positive electric-field direction is repeatedly applied, and then, a reading pulse in the positive electric-field direction is applied to perform reading. This operation is described below by referring to FIG. 5. Data "1" is written, and a transition is made to the polarization state of point F. Then, a voltage of 0 is applied, and the memory state is in the polarization state of point A in FIG. 5. A non-selection voltage of Vs/3 is repeatedly applied to cause the disturbance phenomenon as shown in FIG. 5. Therefore, the amount of polarization charges obtained when a reading pulse Vs in the positive electric-field direction is applied is smaller than the amount Q1 of polarization charges shown in FIG. 3, obtained when the disturbance phenomenon does not occur.

Contrarily, in the driving method according to the present exemplary embodiment, as shown in FIG. 6(B), a pair of non-selection pulses (−Vs/3 and +Vs/3) is always applied during repeatedly generated non-selection periods. Therefore, in the case shown in FIG. 6(B), since the negative-electric-field non-selection pulse (−Vs/3) serves as a voltage pulse in the electric-field direction in which the polarization state of point A in FIG. 5 is not inverted, the disturbance phenomenon is reduced or suppressed similarly.

Unlike the case shown in FIG. 6(B), when data "0" is written in a memory cell by a positive-electric-field writing pulse (Vs), since the positive-electric-field non-selection pulse (Vs/3) of the pair of non-selection pulses (−Vs/3 and +Vs/3) serves as a voltage pulse in the electric-field direction in which the polarization state of point D in FIG. 5 is not inverted, the disturbance phenomenon is reduced or suppressed.

In this way, irrespective of the data storage state, when a voltage pulse in an electric-field direction in which the polarization state used when the data was stored is not inverted is always applied during non-selection periods, it is not necessary to switch the electric-field direction of the non-selection pulse according to the data storage state.

The present exemplary embodiment is not necessarily limited to a case in which a pair of non-selection pulses is applied. A method in which a non-selection pulse in the positive electric-field direction and a non-selection pulse in the negative electric-field direction are alternately applied at a predetermined frequency can be employed.

Figure 7:
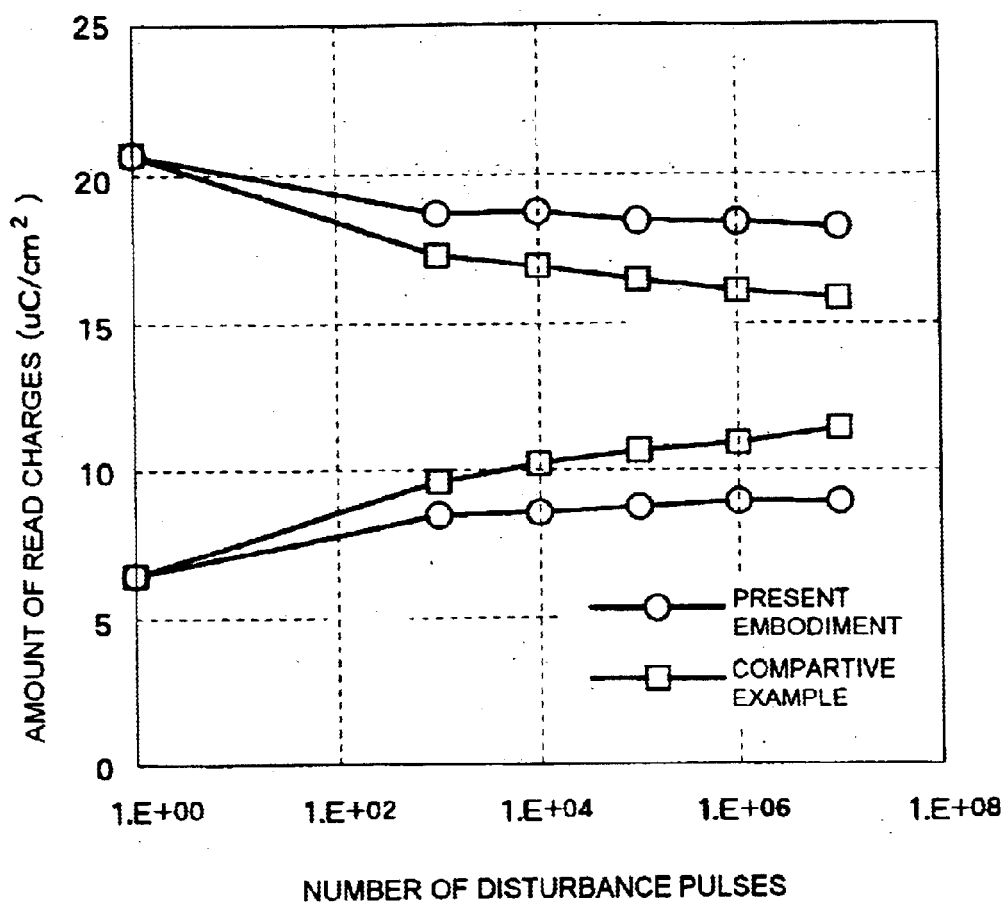
FIG. 7 is a graph showing the relationship between the number of times of non-selection pulses and the amount of read charges for each of the driving methods shown in FIG. 6(A) and FIG. 6(B)

FIG. 7 is a graph showing the relationship between the number of times non-selection pulses are applied and the amount of read charges for each of the comparison example shown in FIG. 6(A) and the exemplary embodiment shown in FIG. 6(B). As clearly shown in FIG. 7, it is understood that, in the present exemplary embodiment, a less adverse effect of the disturbance phenomenon is given, and a larger amount of read charges is obtained.

(Specific example of a driving method in the present exemplary embodiment)

Figure 8:
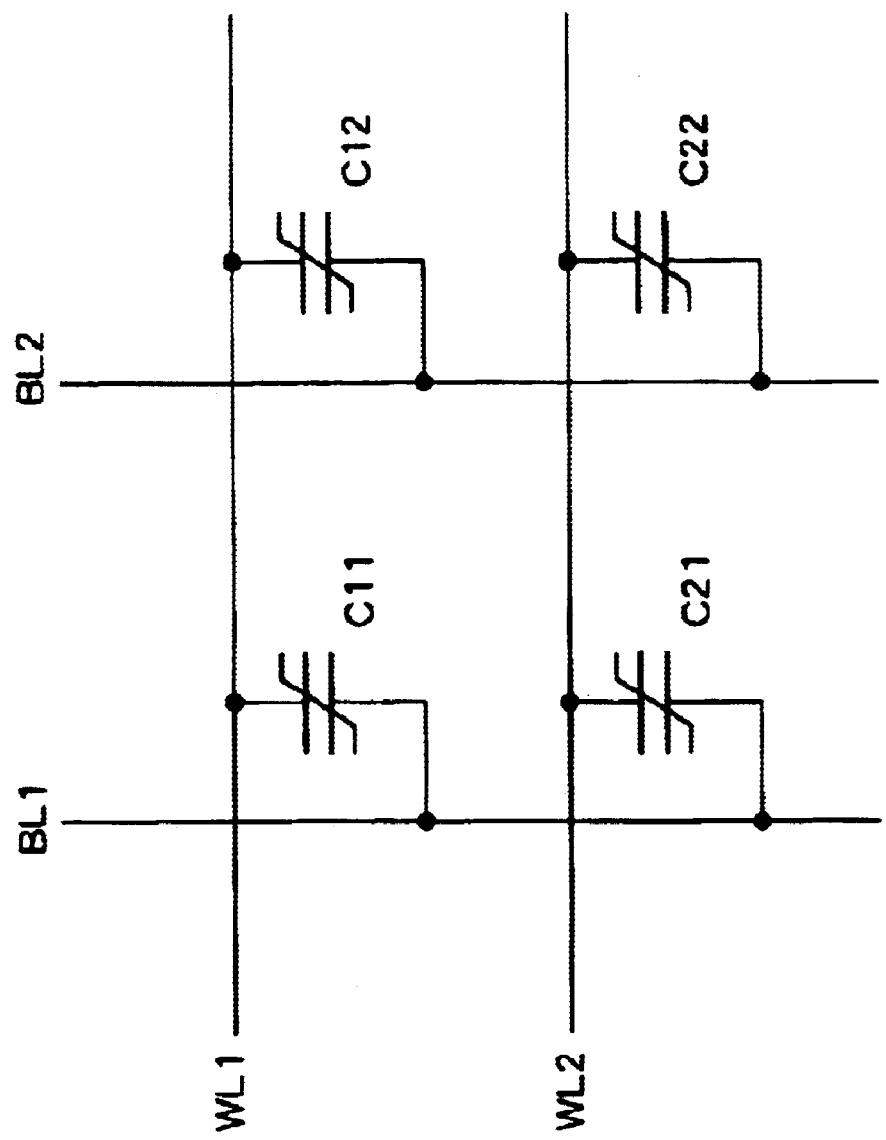
FIG. 8 is an enlarged schematic of a part of the cells shown in FIG. 1.
Figure 9:
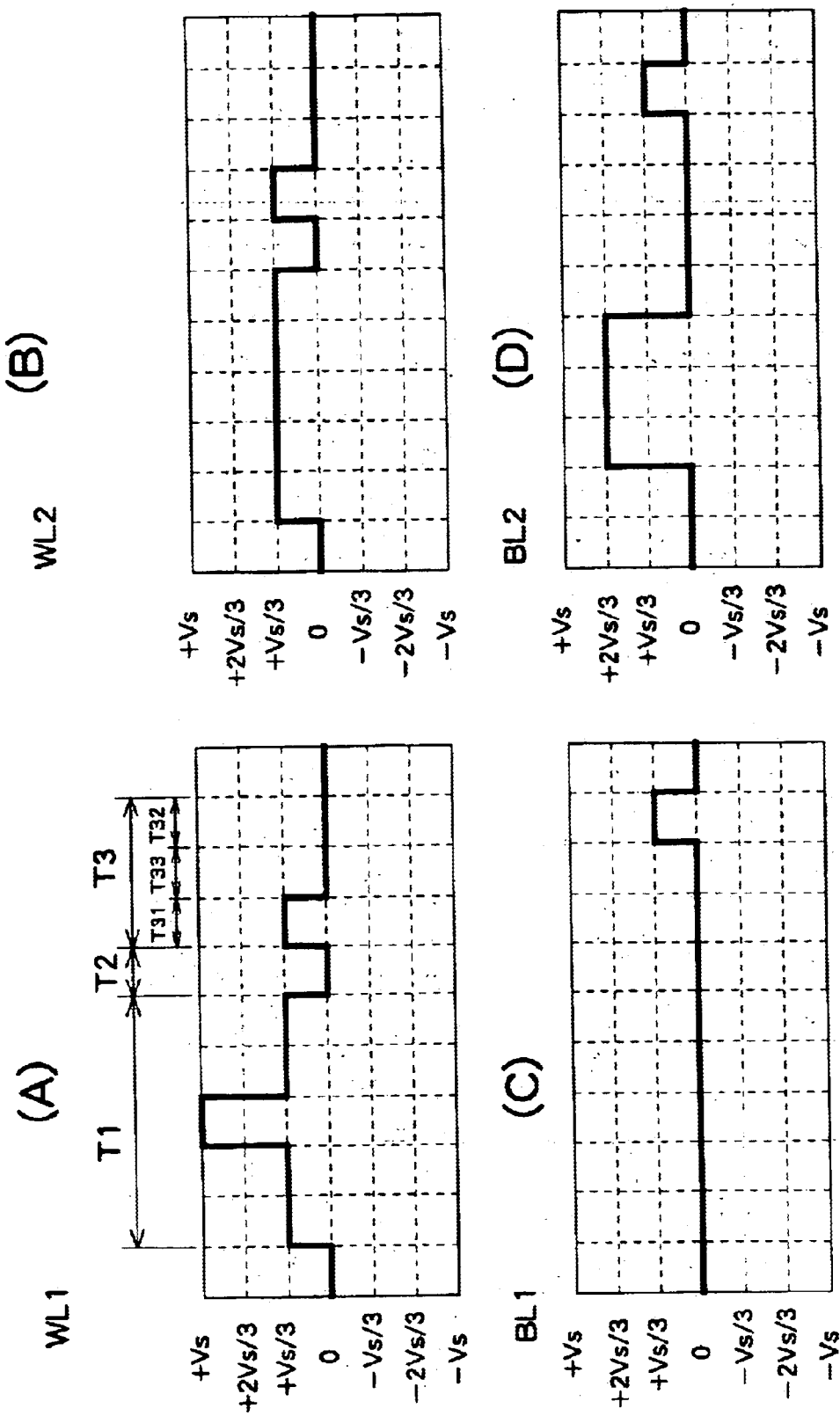
FIGS. 9(A)–9(D) are waveforms showing the potentials of two word lines and two bit lines used when data "0" is written into a selected cell C11 shown in FIG. 8.
Figure 10:
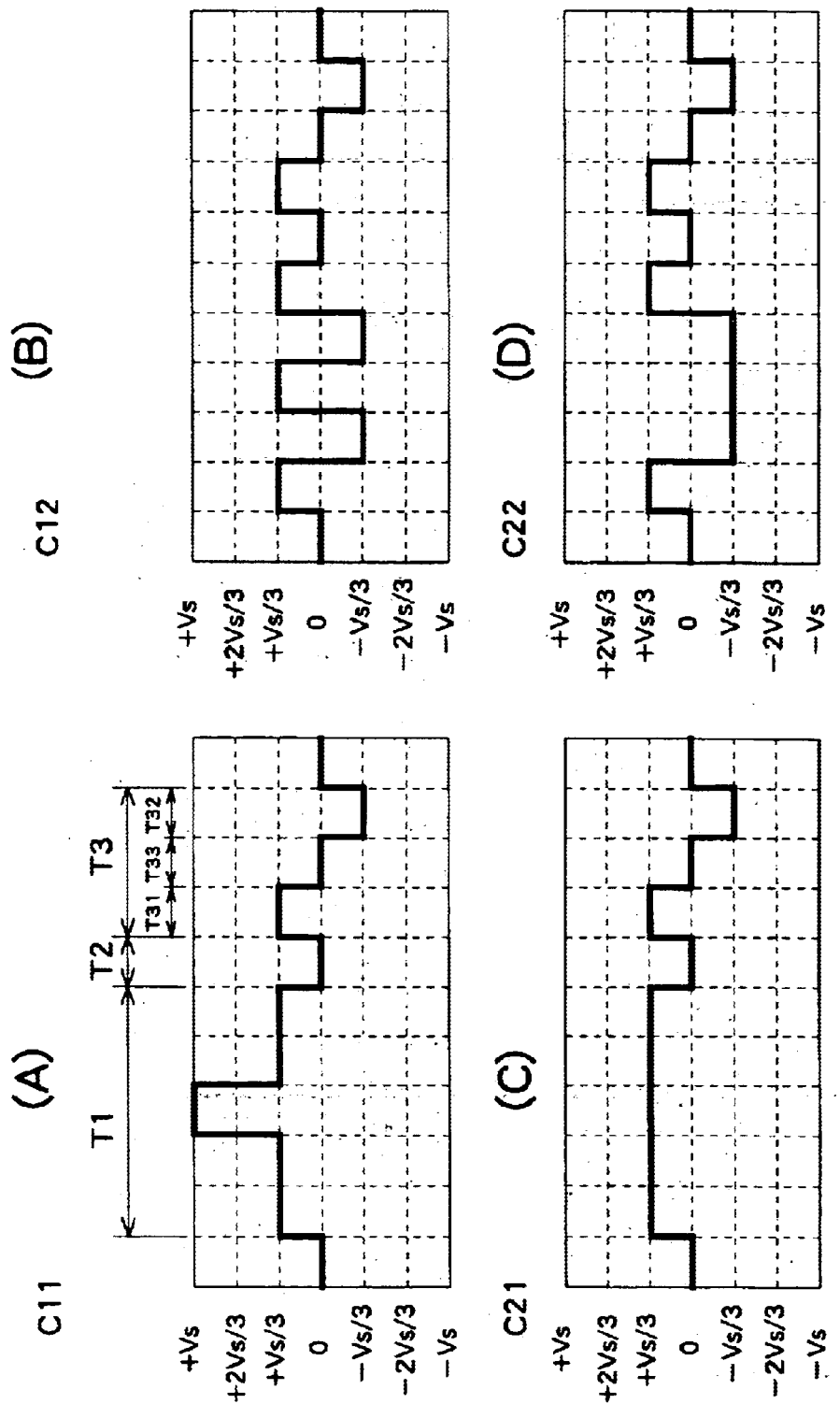
FIGS. 10(A)–10(D) are waveforms showing the voltages applied to the selected cell C11 to a cell C22 shown in FIG. 8, obtained by the potential settings shown in FIGS. 9(A)–9(D)
Figure 11:
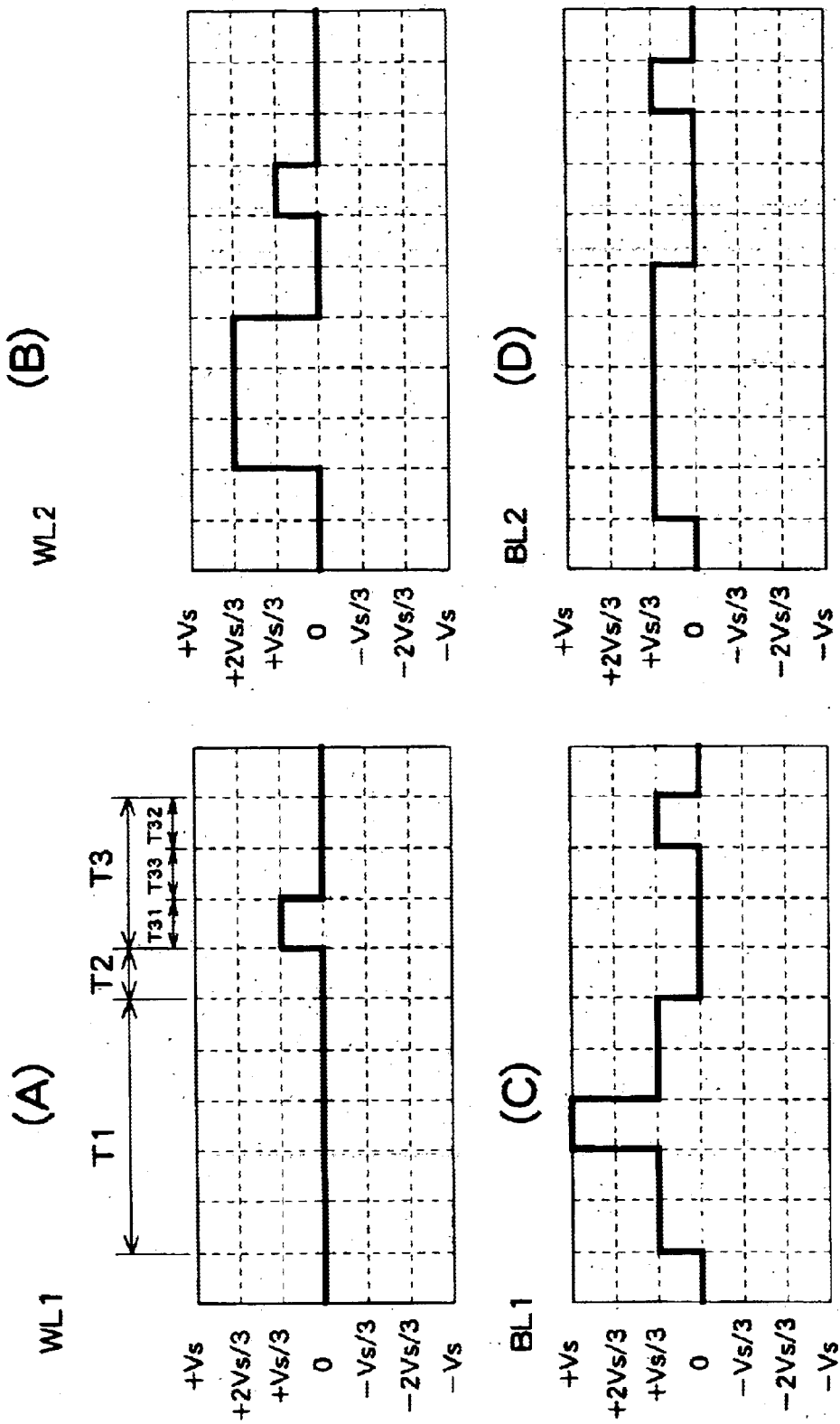
FIGS. 11(A)–FIG. 11(D) are waveforms showing the potentials of the two word lines and the two bit lines used when data "1" is written into the selected cell C11 shown in FIG. 8.
Figure 12:
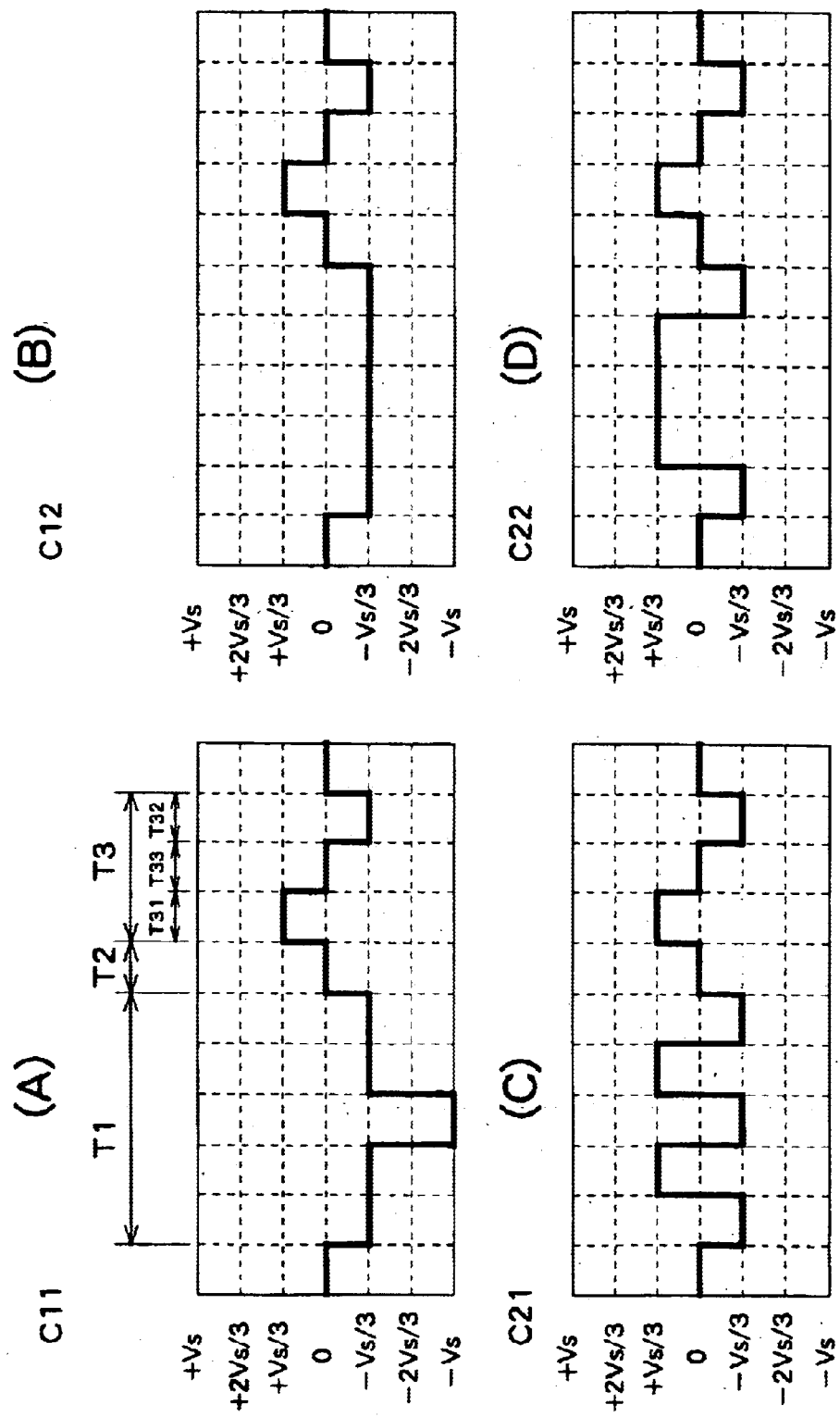
FIGS. 12(A)–12(D) are waveforms showing the voltages applied to the selected cell C11 to the cell C22 shown in FIG. 8, obtained by the potential settings shown in FIGS. 11(A)–11(D)

The driving method according to the present exemplary embodiment is described below more specifically. In the following description, it is assumed that a cell C11 shown in FIG. 8 is a selected cell, and cells C12, C21, and C22 are cells not selected.

FIG. 9(A) to FIG. 9(D) show the potentials of two word lines WL1 and WL2 and the potentials of two bit lines BL1 and BL2, obtained when data "0" is written into the selected cell C11, as shown in FIG. 3, or data "0" and data "1" is read, as shown in FIG. 3. FIG. 10(A) to FIG. 10(D) show the voltages applied to the four cells C11, C12, C21, and C22 when the potentials shown in FIG. 9(A) to FIG. 9(D) are applied to the word lines WL1 and WL2 and the bit lines BL1 and BL2.

A driving period shown in each of the figures is divided into a data "1" writing period T1, an equalization period T2, and a disturbance prevention period T3. In the present exemplary embodiment, it is assumed that the writing period T1=5W, the equalization period T2=W, and the disturbance prevention period T3=3W, where W indicates the minimum pulse width.

To set the selected cell C11 to have the saturated polarization state of point C in FIG. 3, it is necessary to apply a word-line selection potential (Vs) having a pulse width of W, shown in FIG. 9(A) to the word line WL1 connected to the selected cell C11, and to apply a bit-line selection potential (0) shown in FIG. 9(C) to the bit line BL1 connected to the selected cell C11. Then, as shown in FIG. 10(A), the voltage (Vs) in the positive electric-field direction is applied across the selected cell C11. During the writing period T1, a non-selection voltage (±Vs/3) is applied to the not-selected cells C12, C21, and C22. To this end, a word non-selection potential (Vs/3) is applied to the word line WL2 as shown in FIG. 9(B), and a bit-line non-selection potential (2Vs/3) is applied to the bit line BL2 as shown in FIG. 9(D).

Even if each voltage pulse shifts in the time axis in the waveform views shown in FIG. 9(A) to FIG. 9(D), a voltage larger in absolute values than the non-selection voltage (±Vs/3) is not applied to the not-selected cells C12, C21, and C22. For example, at timing when the selection word potential Vs having a pulse width of W is applied to the selection word line WL, the non-selection-bit potential (2Vs/3) having a pulse width of 3W is applied to the bit line BL2. In the same way, at timing when the non-selection bit potential (2Vs/3) having a pulse width of 3W is applied to the bit line BL2, the non-selection word potential (Vs/3) having a pulse width of 5W is applied to the word lines WL1 and L2. With this, even if the voltage pulse of the selection word potential Vs shown in FIG. 9(A) shifts in the time axis, or even if the voltage pulse of the non-selection bit potential (2Vs/3) shown in FIG. 9(D) shifts in the time axis, a voltage larger in absolute values than the non-selection voltage (±Vs/3) is not applied to the not-selected cells C12, V21, and C22.

During the equalization period T2, the potentials of all the word lines and bit lines are set to 0 V. The polarization state of the selected cell is changed such that a transition is made to point C in FIG. 3 at the previous writing period T1, a transition is made to point J within the writing period T1, and a transition is made to point D by an equalization operation. In the not-selected cells, during the writing period T1, a transition is made to either point G or point J (when the state was at point D) or to either point H or point I (when the state was at point A), and then, a transition is made to the original point D or A.

The disturbance prevention period T3 is divided into three zones, a first zone $T_{31}$ and a second zone $T_{32}$ where the non-selection potential (Vs/3) is applied, and a third zone $T_{33}$ where the lines are set to 0 V therebetween. In the first zone $T_{31}$, as shown in FIG. 9(A) and FIG. 9(B), for example, the non-selection potential (Vs/3) is applied to all the word lines WL1 and WL2.

In the second zone $T_{32}$, as shown in FIG. 9(C) and FIG. 9(D), for example, the non-selection potential (Vs/3) is applied to all the bit lines BL1 and BL2. The first zone and the second zone may be switched in their order. The third zone $T_{33}$ is the same as the equalization period T2, described above.

During the disturbance prevention period T3, as shown in FIG. 10(A) to FIG. 10(D), the positive-electric-field non-selection potential (Vs/3) is applied in the first zone T31, and the negative-electric-field non-selection voltage (−Vs/3) is applied in the second zone T32, to all the cells C11, C12, C21, and. C22. Therefore, according to the principle described by referring to FIG. 6(B), disturbance is reduced or prevented.

As shown in FIGS. 10(A)–10(D), during the writing period T1, when data "0" is written into the selected cell C11, whether the positive-direction non-selection voltage (Vs/3) or the negative-direction non-selection voltage (−Vs/3) is applied to the not-selected cells C12, C21, and C22 is determined depending on the position of the selected cell and others.

The non-selection voltages (±Vs/3) in both electric-field directions are applied to the not-selected cells C12 and C22 shown in FIG. 10(B) and FIG. 10(D) during the writing period T1, but the non-selection voltage in one electric-field direction is continuously applied to the not-selected cell C21 shown in FIG. 10(C) during the writing period T1. Therefore, depending on the memory state of the not-selected cell C21, the most severe adverse effect of disturbance occurs. Even in this case, by providing the disturbance period T3 according to the present exemplary embodiment, since a non-selection voltage in the electric-field direction in which the memory state is not inverted is always applied periodically, the disturbance problem is reduced or suppressed.

FIGS. 11(A)–11(D) show the potentials of the two word lines WL1 and WL2 and the potentials of the two bit lines BL1 and BL2, obtained when data "1" is written into the selected cell C11, as shown in FIG. 3. FIG. 12(A) to FIG. 12(D) show the voltages applied to the four cells C11, C12, C21, and C22 when the potentials shown in FIG. 11(A) to FIG. 11(D) are applied to the word lines WL1 and WL2 and the bit lines BL1 and BL2.

In FIGS. 11(A)–12(D), waveforms during the writing period T1 differ from those in FIGS. 9(A)–10(D) due to the difference in operation mode, but the same waveforms are used during the disturbance period T3. Therefore, even when data "0" is reduced or written, disturbance is prevented.

(Method for setting disturbance prevention period)

In the above-described exemplary embodiment, the disturbance prevention period is provided every time a writing operation, a re-writing operation, and a reading operation are finished. The disturbance period may be provided every time a plurality of these operations is finished.

Figure 13:
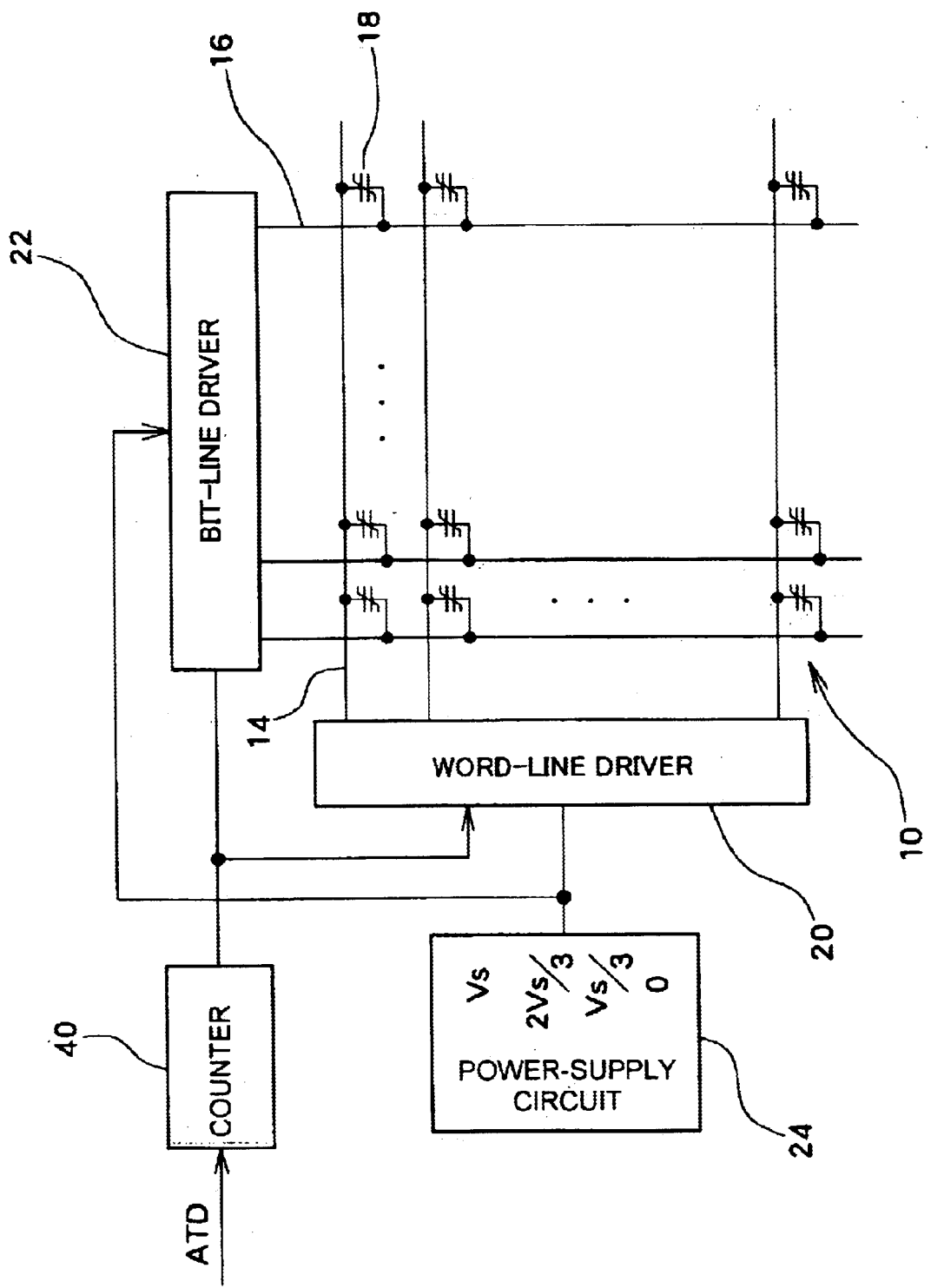
FIG. 13 is a schematic of a ferroelectric storage apparatus having a counter which decides timing when a disturbance prevention step is executed.

To this end, as shown in FIG. 13, a counter 40 can be provided, which counts the number of times a writing operation or a reading operation is performed, and which instructs to start the operation of the disturbance prevention period T3 when the count reaches a predetermined value. The counter 40 may count, for example, an address transition signal ATD to count the number of times a writing operation or a reading operation is performed. It is necessary to always perform a re-writing operation immediately after a reading operation, and to perform writing twice, namely, to write data "0" and data "1"in a writing operation. Therefore, when the counter 40 counts the address transition signal ATD once, it means that the above-described two operations are finished. With this taken into account, the count needs to be determined.

Figure 14:
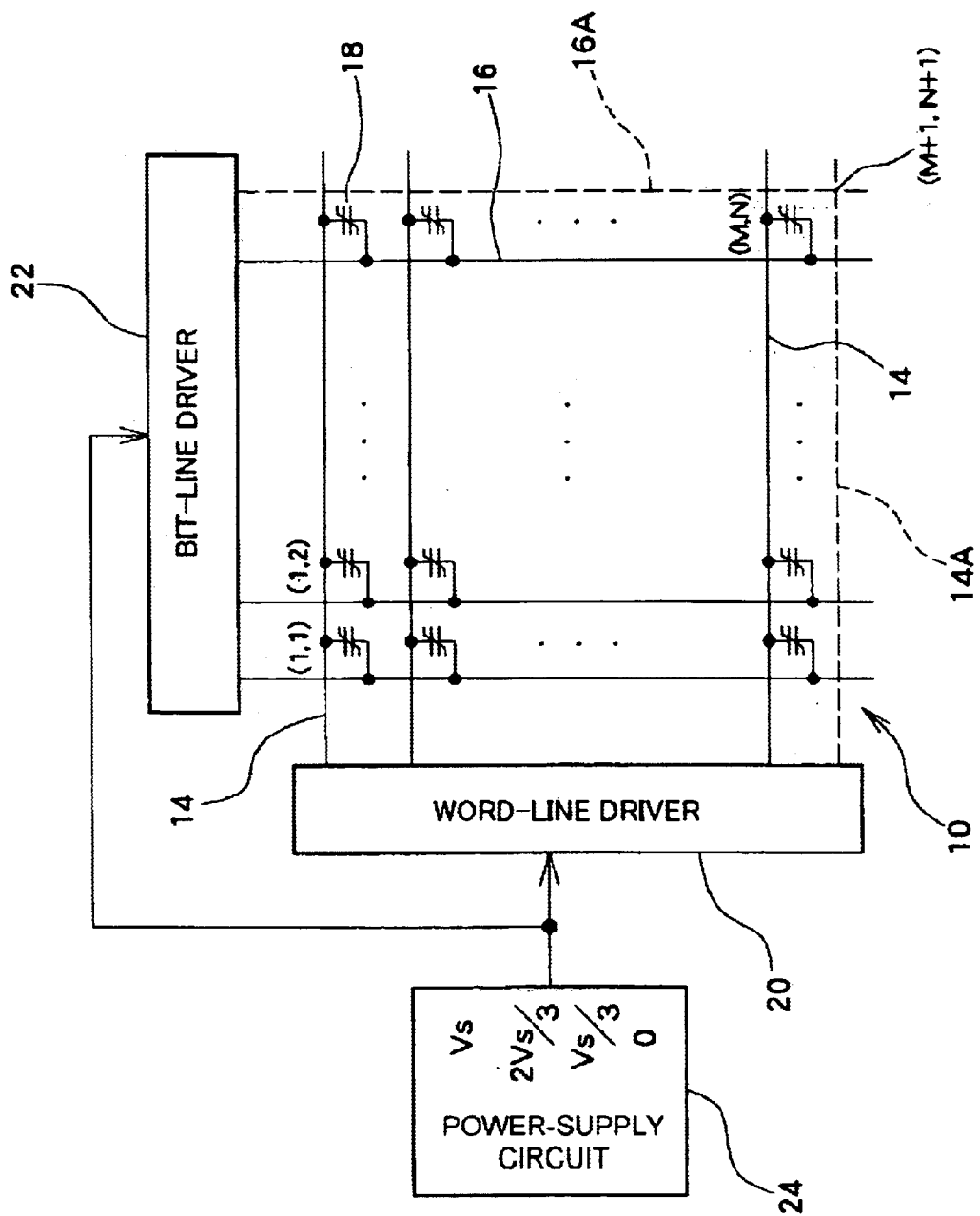
FIG. 14 is a schematic of a ferroelectric storage apparatus which determines timing when the disturbance prevention step is executed, by the designation of an imaginary address.

FIG. 14 shows another exemplary embodiment in which the operation of the disturbance prevention period T3 is performed when a dummy address (M+1, N+1) which is not used as a memory address is specified.

In FIG. 14, there are N effective word lines 14, M effective bit lines 16, and a total of M-by-N ferroelectric memory cells 18. The (N+1)-th imaginary word line 14A and the (M+1)-th imaginary bit line 16A are assumed. The address (M+1, N+1) is also an imaginary address.

Any actual address, (l, l) to (M, N), is specified, and the above-described writing and reading operations are performed. Since the word-line driver 20 and the bit-line driver 22 includes address decoders as described above, when an effective address is specified, the above-described operation step is executed. The word-line driver 20 and the bit-line driver 22 are set such that when an imaginary address, for example, the address (M, N) is specified, the disturbance prevention step is performed. With this, the disturbance prevention step can be executed just by specifying an address, without using the counter 40 and others.

The present invention is not limited to the above-described exemplary embodiments. Within the scope of the gist of the present invention, various modifications are possible.

What is claimed is:

1. A driving method for a ferroelectric storage apparatus, comprising:
   first applying one of data reading, data re-writing, and data writing to at least one selected cell among a plurality of ferroelectric memory cells formed at the intersections of a plurality of word lines and a plurality of bit lines; and
   second applying a voltage to each of the plurality of ferroelectric memory cells in an electric-field direction in which the stored data of each ferroelectric memory cell is not inverted, after the first applying is executed at least once.

2. The driving method for a ferroelectric storage apparatus according to claim 1,
   further including forming each of the plurality of ferroelectric memory cells is formed of a ferroelectric capacitor only.

3. The driving method for a ferroelectric storage apparatus, according to claim 1, the first applying including applying one of a first-polarity selection voltage and a second-polarity selection voltage to the at least one selected cell, and applying one or both of a first-polarity non-selection voltage and a second-polarity non-selection voltage to not-selected cells; and
   the second applying including alternately applying the first-polarity non-selection voltage and the second-polarity non-selection voltage to each of the plurality of ferroelectric memory cells.

4. A ferroelectric storage apparatus, comprising:
   a plurality of word lines disposed in parallel to each other;
   a plurality of bit lines disposed in parallel to each other and intersecting with the plurality of word lines;
   a plurality of ferroelectric memory cells formed at intersections of the plurality of word lines and the plurality of bit lines;
   a word-line driver to drive the plurality of word lines; and
   a bit-line driver to drive the plurality of bit lines,
   the word-line driver and the bit-line driver applying an operation mode of one of data reading, data re-writing, and data writing to at least one selected cell among the plurality of ferroelectric memory cells, and applying a voltage to each of the plurality of ferroelectric memory cells in an electric-field direction in which the stored data of each ferroelectric memory cell is not inverted, during a disturbance prevention mode performed after the operation mode is performed at least once.

5. The ferroelectric storage apparatus according to claim 4,
   each of the plurality of ferroelectric memory cells being formed of a ferroelectric capacitor only.

6. The ferroelectric storage apparatus according to claim 4,
   the word-line driver and the bit-line driver applying, in the operation mode, one of the first-polarity selection voltage and the second-polarity selection voltage to the at least one selected cell, and applying one or both of a first-polarity non-selection voltage and a second-polarity non-selection voltage to not-selected cells; and
   in the disturbance prevention mode, applying the first-polarity non-selection voltage and the second-polarity non-selection voltage alternately to each of the plurality of ferroelectric memory cells.

7. The ferroelectric storage apparatus according to claim 6,
   in the operation mode, the word-line driver supplying one of two types of selection potentials to a word line connected to the at least one selected cell, and supplying one of two types of non-selection potentials to word lines connected to the not-selected cells, and the bit-line driver supplying the other of the two types of selection potentials to a bit line connected to the at least one selected cell, and supplying the other of the two types of non-selection potential to bit lines connected to the not-selected cells; and
   the disturbance prevention mode being divided into a first zone and a second zone; in the first zone, the word-line driver supplying one of the two types of non-selection potentials to the plurality of word lines, and the bit-line driver supplying the other of the two types of non-selection potentials to the plurality of bit lines; and in the second zone, the word-line driver supplying the other of the two types of non-selection potentials to the plurality of word lines, and bit-line driver supplying the one of the two types of non-selection potentials to the plurality of bit lines.

8. The ferroelectric storage apparatus according to claim 7,
the word-line driver and the bit-line driver setting the plurality of word lines and the plurality of bit lines to the same potential during a third zone provided between the first zone and the second zone.

9. The ferroelectric storage apparatus according to claim 5,
further including a counter to count the number of times the operation mode is performed, and the word-line driver and the bit-line driver performing the disturbance prevention mode according to the output of the counter.

10. The ferroelectric storage apparatus according to claim 5,
the word-line driver being connected to N word lines, the bit-line driver being connected to M bit lines, a total of N-by-M ferroelectric memory cells being disposed, and the word-line driver and the bit-line driver performing the operation mode when at least one effective address in the N-by-M ferroelectric memory cells is selected, and performing the disturbance prevention mode when a dummy address other than the effective address is selected.

11. A driving circuit connected to a ferroelectric storage section provided with a plurality of ferroelectric memory cells formed at the intersections of a plurality of word lines and a plurality of bit lines, the driving circuit comprising:

a word-line driver to drive the plurality of word lines; and a plurality of bit-line drivers to drive the plurality of bit lines, the word-line driver and the bit-line drivers applying an operation mode of one of data reading, data re-writing, and data writing to at least one selected cell among the plurality of ferroelectric memory cells, formed at the intersections of the plurality of word lines and the plurality of bit lines, and applying a voltage to each of the plurality of ferroelectric memory cells in an electric-field direction in which the stored data of each ferroelectric memory cell is not inverted, during a disturbance prevention mode performed after the operation mode is performed at least once.

* * * * *